United States Patent
Koo et al.

(10) Patent No.: US 7,187,005 B2
(45) Date of Patent: Mar. 6, 2007

(54) FLAT PANEL DISPLAY WITH THIN FILM TRANSISTOR

(75) Inventors: Jae-Bon Koo, Yongin (KR); Ji-Yong Park, Suwon (KR); Hye-Dong Kim, Seongnam (KR); Ul-Ho Lee, Yongin (KR)

(73) Assignee: Samsung SDI Co., Ltd., Suwon (KR)

( * ) Notice: Subject to any disclaimer, the term of this patent is extended or adjusted under 35 U.S.C. 154(b) by 11 days.

(21) Appl. No.: 10/727,222

(22) Filed: Dec. 4, 2003

(65) Prior Publication Data

US 2004/0217353 A1 Nov. 4, 2004

(30) Foreign Application Priority Data

May 1, 2003 (KR) .................. 10-2003-0027990

(51) Int. Cl.
*H01L 29/04* (2006.01)
*H01L 29/786* (2006.01)

(52) U.S. Cl. ............ 257/72; 257/64; 257/E29.294; 257/E29.273

(58) Field of Classification Search ........... 257/64, 257/72, 66, 75, 88, 89, 401, E29.294, E29.273; 438/166, 158; 315/169.3
See application file for complete search history.

(56) References Cited

U.S. PATENT DOCUMENTS 6,177,301 B1 * 1/2001 Jung ................. 438/150

6,337,232 B1   1/2002 Kusumoto et al.
6,456,013 B1 * 9/2002 Komiya et al. .......... 315/169.1
2003/0062845 A1 * 4/2003 Yamazaki et al. ....... 315/169.3

FOREIGN PATENT DOCUMENTS

JP    2001-109399      4/2001
KR    1020010067258    7/2001

* cited by examiner

*Primary Examiner*—Matthew C. Landau
(74) *Attorney, Agent, or Firm*—H.C. Park & Associates, PLC

(57) ABSTRACT

A flat panel display lowering an on-current of a driving thin film transistor (TFT), maintaining high switching properties of a switching TFT, maintaining uniform brightness using the driving TFT, and maintaining a life span of a light emitting device while the same voltages are applied to the switching TFT and the driving TFT without changing a size of an active layer. The flat panel display has a light emitting device, a switching thin film transistor including a semiconductor active layer having at least a channel area for transferring a data signal to the light emitting device, and a driving thin film transistor including a semiconductor active layer having at least a channel area for driving the light emitting device so that a predetermined current flows through the light emitting device according to the data signal, the channel areas of the switching TFT and the driving TFT having different directions of current flow.

20 Claims, 6 Drawing Sheets

FLAT PANEL DISPLAY WITH THIN FILM TRANSISTOR

BACKGROUND OF THE INVENTION

This application claims the priority of Korean Patent Application No. 10-2003-0027990 filed on May 1, 2003, in the Korean Intellectual Property Office, the disclosure of which is incorporated herein in its entirety by reference.

1. Field of the Invention

The invention relates to an active matrix type flat panel display including a thin film transistor (TFT), and more particularly, to a flat panel display including a TFT having a polycrystalline silicon as an active layer, and channel areas of the active layers in a switching TFT and a driving TFT having different directions.

2. Description of the Related Art

A thin film transistor (TFT) in a flat display device such as a liquid display device, an organic electroluminescence display device, or an inorganic electroluminescence display device is used as a switching device for controlling operations of pixels and as a driving device for driving the pixels.

The TFT includes a semiconductor active layer having a drain area and a source area which are doped with a high concentration of impurities and a channel area formed between the drain area and the source area, a gate insulating layer formed on the semiconductor active layer, and a gate electrode formed on the gate insulating layer which is located on an upper part of the channel area of the active layer. The semiconductor active layer can be classified as an amorphous silicon of a polycrystalline silicon according to the crystallized status of the silicon.

A TFT using amorphous silicon is advantageous in that a deposition can be performed at a low temperature, however, it is disadvantageous in that an electrical property and a reliability of the TFT are degraded. Also, it is difficult to make larger display devices. Thus, recently polycrystalline silicon is being used. Polycrystalline silicon has a higher mobility of about tens to hundreds of $cm^2/V \cdot s$, and low high frequency operation property and leakage current value. Thus, polycrystalline silicon is suitable for use in larger-sized flat panel displays of high resolution.

A TFT is used as the switching device or the driving device of the pixel in the flat panel display, as described above. An organic electroluminescence display device of an active matrix type with an active driving method includes at least two TFTs per sub-pixel.

The organic electroluminescence device has an emission layer made of an organic material between an anode electrode and a cathode electrode. In the organic electroluminescence device, when a positive voltage and a negative voltage are applied respectively to the electrodes, holes injected from the anode electrode are moved to the emission layer through a hole transport layer, and electrons are injected into the emission layer through an electron transport layer from the cathode electrode. The holes and electrons are recombined on the emission layer to produce exitons. The exitons are changed from an excited status to a ground status, and accordingly, phosphor molecules in the emission layer are radiated to form an image. In case of a full-color electroluminescence display, pixels radiating red (R), green (G), and blue (B) colors are disposed as electroluminescence devices to realize the full colors.

In the active matrix type organic electroluminescence display device, a panel with high resolution is required, however, the above described TFT formed using the polycrystalline silicon of high function causes some problems in this case.

That is, in the active matrix type flat panel display device, such as, the organic electroluminescence display device, the switching TFT and the driving TFT are made of the polycrystalline silicon. Thus, the switching TFT and the driving TFT have the same current mobility. Therefore, switching properties of the switching TFT and low current driving properties of the driving TFT cannot be satisfied simultaneously. That is, when the driving TFT and the switching TFT of a high resolution display device are fabricated using the polycrystalline silicon, which has a larger current mobility, the high switching property of the switching TFT can be obtained, however, the brightness becomes too bright because an amount of current flowing toward an electroluminescence (EL) device through the driving TFT is hither. Thus a current density per unit area of the device is increased while a life time of the EL device is decreased.

On the other hand, when the switching TFT and the driving TFT of the display device are fabricated using the amorphous silicon which has a low current mobility, the TFTs should be fabricated in such way that the driving TFT uses a small current and the switching TFT uses a large current.

To solve the above problems, methods for restricting current flowing through the driving TFT are provided, such as, a method for increasing resistance of a channel area by reducing a ratio of a length to a width of the driving TFT (W/L) and a method for increasing resistance by forming a low doped area on the source/drain areas of the driving TFT.

However, in the method decreasing the W/L by increasing the length, a length of the channel area increases, thus forming stripes on the channel area and reducing an aperture area in a crystallization process in an excimer laser annealing (ELA) method. The method decreasing W/L by reducing the width is limited by a design rule of a photolithography process, and it is difficult to ensure a reliability of the TFT.

Also, the method for increasing the resistance by forming the low doped area requires an additional doping process.

A method for increasing TFT properties by reducing a thickness of the channel area is disclosed in U.S. Pat. No. 6,337,232.

The method for reducing a ratio of a length for a width of the driving TFT is disclosed in Japanese Publication No. 2001-109399.

SUMMARY OF THE INVENTION

The invention provides a flat panel display in which an on-current of a driving thin film transistor (TFT) is lowered while keeping constant a driving voltage applied thereto, without changing a size of an active layer of the TFT.

The invention separately provides a flat panel display capable of maintaining high switching properties of a switching TFT, satisfying uniform brightness by a driving TFT, and maintaining a life span of a light emitting device.

According to an aspect of the invention, there is provided a flat panel display comprising a light emitting device, a switching TFT including a semiconductor active layer having at least a channel area for transferring a data signal to the light emitting device, and a driving TFT including a semiconductor active layer having at least a channel area for driving the light emitting device so that a predetermined current flows through the light emitting device according to the data signal, the channel area of the switching TFT and the channel area of the driving TFT having different direction of current flow.

In various embodiments of the invention the current direction of flow in the channel areas may be formed so that current mobilities on the channel areas of the switching TFT and the driving TFT are different from each other.

In various embodiments of the invention the current direction of flow in the channel areas may be formed so that the current mobility in the channel area of the switching TFT is larger than that of the channel area of the driving TFT.

In various embodiments of the invention the active layer may be formed using a polycrystalline silicon.

In various embodiments of the invention the polycrystalline silicon may have anisotropic crystal grains.

In various embodiments of the invention the crystal grain of the polycrystalline silicon may have a length in a certain direction which is at least 1.5 times longer than a width of the crystal grain.

In various embodiments of the invention the channel areas of the switching TFT and the driving TFT may have polycrystalline silicon crystal grains whose length directions make different angles with for the direction of current flow in the channel area of each.

In various embodiments of the invention, the direction of current flow in the channel areas may be formed so that an angle made by the length direction of the polycrystalline silicon crystal grain for the direction of current in the channel area of the driving TFT is larger than that made by the length direction of the polycrystalline silicon crystal grain forming the channel area for the current flowing direction on the channel area of the switching TFT.

In various embodiments of the invention, the polycrystalline silicon may include substantially parallel primary grain boundaries, and side grain boundaries of anisotropic grains which extend substantially perpendicular between the primary grain boundaries and have shorter intervals therebetween than the internals between the primary grain boundaries.

In various embodiments of the invention, angles of the primary grain boundaries of the polycrystalline silicon with the direction of current flow in the channel areas of the switching TFT and the driving TFT may be different from each other.

In various embodiments of the invention, the angle of the primary grain boundary of the polycrystalline silicon forming the channel area with the direction of current flow in on the channel area of the switching TFT may be larger than that of the primary grain boundary of the polycrystalline silicon forming the channel area with the direction of current flow in the channel area of the driving TFT.

In various embodiments of the invention, the angle of the primary grain boundaries with the direction current flow in the channel area of the switching TFT may be about 90°.

In various embodiments of the invention, the angle of the primary grain boundaries of the polycrystalline silicon which forms the channel area of the driving TFT with the direction current flow in the channel area may be about 0°.

In various embodiments of the invention, the angle of the side grain boundaries of anisotropic grains of the polycrystalline silicon forming the channel area of the switching TFT with the direction of current flow in that channel area may be in a range of about −45° to about 45°.

In various embodiments of the invention, the angle of the side grain boundaries of anisotropic grains with the direction of current flow in the channel area of the driving TFT may be in a range of about 45° to about 135°.

According to another aspect of the invention, there is provided a flat panel display comprising a light emitting device, a switching TFT which is formed using a polycrystalline silicon and includes a semiconductor layer having a channel area for transferring a data signal to the light emitting device, and a driving TFT which is formed using a polycrystalline silicon and includes a semiconductor layer having a channel area for driving the light emitting device so that a predetermined amount of current flows on the light emitting device. The switching TFT and the driving TFT having different angles which are made by length directions of polycrystalline silicon crystal grains forming the channel areas and the direction of current flow in the respective channel areas.

In various embodiments of the invention, the angle of the length direction of the polycrystalline silicon crystal grain for the channel area of the switching TFT may be larger than that of the channel area of the driving TFT.

In various embodiments of the invention, the polycrystalline silicon may include anisotropic crystal grains.

In various embodiments of the invention, the crystal grain of the polycrystalline silicon may have a length which is at least 1.5 times longer than a width of the crystal grain, the length being substantially perpendicular to the length.

In various embodiments of the invention, the angle of the length direction of the polycrystalline silicon forming the channel area with the direction of current flow in the channel area of the driving TFT may be larger than the angle of the length direction of the polycrystalline silicon forming the channel area with the direction of current flow in the channel area of the switching TFT.

In various embodiments of the invention, the polycrystalline silicon may include substantially parallel primary grain boundaries, and side grain boundaries of anistropic grains which extend substantially perpendicularly between the primary grain boundaries and have shorter intervals therebetween than those of the primary grain boundaries.

In various embodiments of the invention, angles of the primary grain boundaries of the polycrystalline silicon with the direction of current flow in the channel areas of the switching TFT and the driving TFT may be different from each other.

In various embodiments of the invention, the angle of the primary grain boundary of the polycrystalline silicon forming the channel area with the direction of current flow in the channel area of the switching TFT may be larger than that of the primary grain boundary of the polycrystalline silicon forming the channel area with the direction of current flow in the channel area of the driving TFT.

In various embodiments of the invention, the angle of the primary grain boundaries with the direction of current flow on the channel area of the switching TFT may be about 90°.

In various embodiments of the invention, the angle of the primary grain boundaries of the polycrystalline silicon which forms the channel area of the driving TFT with the direction of current flow in the channel area may be about 0°.

In various embodiments of the invention, the angle of the side grain boundaries of anisotropic grains forming the channel area of the switching TFT with the direction of current flow in that channel area may be in a range of about −45° to about 45°.

In various embodiments of the invention, the angle of the side grain boundaries of anisotropic grains with the direction of current flow in the channel area of the driving TFT may be in a range of about 45° to about 135°.

BRIEF DESCRIPTION OF THE DRAWINGS

The features of the invention will become more apparent by the balancing detailed description exemplary embodiments thereof with reference to the attached drawings.

DETAILED DESCRIPTION OF THE INVENTION

Figure 1:
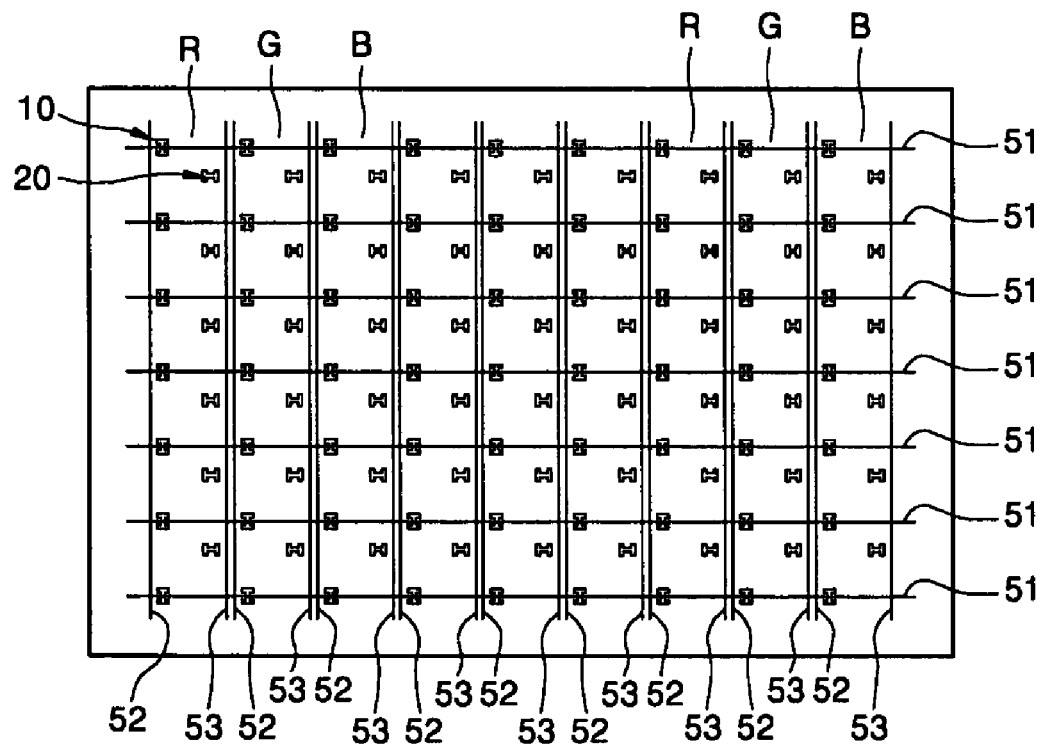
FIG. 1 is a plane view of a structure of an active layer on a thin film transistor (TFT) in an active matrix type electroluminescence display device according to an exemplary embodiment of the invention.

FIG. 1 is a plane view of an active layer structure of a thin film transistor (TFT) in an active matrix type organic electroluminescence display according to an embodiment of the present invention. As shown in FIG. 1, red (R), green (G), and blue (B) sub-pixels are repeatedly arranged in a longitudinal direction (that is, in an up-and-down direction) in the pixels of the organic electroluminescence display. However, the arrangement of the pixels is not limited to the above structure, and the sub-pixels of respective colors can be arranged in various patterns, such as, a mosaic pattern, or a grid type pattern to construct the pixel. Also, a mono-color flat panel display can be used instead of the full-color flat panel display shown in FIG. 1.

In the organic electroluminescence display, a plurality of gate lines 51 are arranged in a transverse direction (left-and-right direction), and a plurality of data lines 52 are arranged in a longitudinal direction. Also, driving lines 53 for supplying driving voltages (Vdd) are arranged in the longitudinal direction. The gate line 51, the data line 52, and the driving line 53 are disposed to surround one sub-pixel.

In above construction, each sub-pixel of the R, G, and B pixels includes at least two TFTs, such as, a switching TFT and a driving TFT. The switching TFT transfers a data signal to a light emitting device according to a signal of the gate line 51 to control operations of the light emitting device, and the driving TFT drives the light emitting device so that a predetermined current flows on the light emitting device according to the data signal. The number of TFTs and the arrangement of TFTs, such as, the arrangement of the switching TFT and the driving TFT can be varied based on the properties of the display device and a driving method of the display device.

The switching TFT 10 and the driving TFT 20 include a first active layer 111 and a second active layer 21, respectively. Semiconductor active layers, and the active layers 11 and 21 include channel areas (not shown) which will be described later. The channel areas are the areas located on center portions of the first active layer 11 and the second active layer 21 in a current flowing direction.

As shown in FIG. 1, in sub-pixels forming the R, G, and B pixels, the first active layer 11 included in the switching TFT 10 and the second active layer 21 included in the driving TFT 20 can be formed such that each has a different thickness. The first active layer 11 and the second active layer 21 can be formed commonly regardless of the R, G, and B pixels, however, a white balance can be maintained by differentiating a crystallized structure of the second active layer 21 forming the driving TFT 20, although this is not shown in drawings.

According to an exemplary embodiment of the present invention, the first active layer 11 and the second active layer 21 can be formed using a polycrystalline silicon thin film. The first active layer 11 and the second active layer 21 formed by the polycrystalline silicon thin film are arranged along a direction which is different from the direction of the other. Here, it is sufficient that the channel areas of the first active layer 11 and the second active layer 21 are formed along different directions. However, generally, entire active layers are formed along different directions due to a complexity in designing TFT. Therefore, the directions of the channel areas of TFT active layers are described as the directions of active layers, and in various exemplary embodiments of the invention the first active layer 11 and the second active layer 21 are formed along different directions. The above is valid for all embodiments which will be described later.

According to the invention, the channel areas in the active layers of switching TFT and the driving TFT are formed along different directions from each other, and accordingly, current transferred from the driving TFT to the light emitting device is reduced without changing the sizes of active layers to realize high resolution.

As described above, in the organic electroluminescence display device, an on-current of the switching TFT increases and the on-current of the driving TFT decreases such that the high resolution can be achieved, even in a case of a small size. In the invention, control of the on-currents can be realized by differentiating directions of the active layers of respective TFTs. That is, the on-current of the switching TFT is increased and the on-current of the driving TFT is decreased by controlling the direction of the channel areas of the active layers of the TFTs.

Thus, the directions of the switching TFT active layer and the driving TFT active layer can be chosen based on the current mobilities of the channel areas of the respective active layers. When the current mobility is large in the channel area of the active layer, the on-current is also large, and when the current mobility in the channel area is small on the channel area, the on-current is also small. Consequently, as described above, in order to realize the high resolution by lowering the on-current of the driving TFT, the direction of driving TFT active layer and the direction of switching TFT active layer should be controlled so that the current mobility on the channel area of the driving TFT active layer is lower than the current mobility of the channel area of the switching TFT active layer.

The difference in current mobilities can be changed according to a crystallization structure of the polycrystalline silicon thin film forming the active layer. That is, different current mobilities can be obtained by forming the active layers of TFTs such that they are formed along different directions of the polycrystalline silicon based on the crystallization structure of the polycrystalline silicon thin film.

Figure 2:
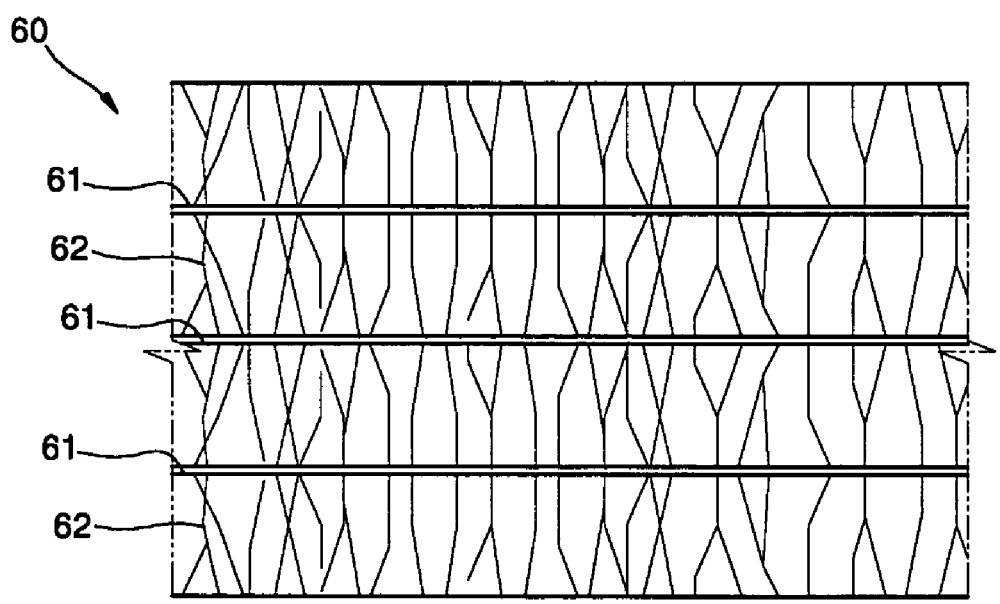
FIG. 2 is a plane view of an anisotropic crystallization structure of a polycrystalline silicon thin film forming the active layer of the TFT.

FIG. 2 is a view of an anisotropic crystallization structure of a polycrystalline silicon thin film forming the active layer of a TFT. The polycrystalline silicon thin film having the anisotropic crystallization structure shown in FIG. 2 is formed by crystallizing an amorphous silicon thin film using a sequential lateral solidification (SLS) method. However, the anisotropic crystallization structure is not limited to the structure formed by the SLS method. Any crystallization method can be applied in the invention if the crystallization structure of the polycrystalline silicon thin film is anisotropic. Generally, a crystallization method using a laser is used.

The SLS method uses a fact that a majority of crystal grains of silicon grow toward a substantially perpendicular direction at an interface between a liquid phase silicon region and a solid phase silicon region. A part of the amorphous silicon is melted by transmitting a laser beam using a mask, the grain grows toward the melted silicon part from the interface between the melted silicon part and the non-melted silicon part.

As shown in FIG. 2, the crystallization structure formed in SLS method includes a plurality of primary grain boundaries 61 apart from each other at predetermined intervals, and side grain boundaries of anisotropic grains 62 extending in roughly perpendicular directions from the primary grain boundaries 61 between the primary grain boundaries 61. Respective side grain boundaries of anisotropic grains 62 which are melted and grown by a mask meet each other at the primary grain boundaries 61. Intervals between the primary grain boundaries 61 are larger than those of side grain boundaries of anisotropic grains 62. Therefore, the silicon thin film has the side grain boundaries of anisotropic grains 62 formed between the primary grain boundaries 61. In addition, generally, the crystal grains having the above grain boundaries are formed extending a long a length of the polycrystalline silicon, where the length of the crystal grain is longer than a width of the crystal grain so that a side in a certain direction is longer than another side vertical for the above side. The longer side may be, for example, about 1.5 times or more longer than the shorter side.

The silicon thin film 60 having the primary and side grain boundaries of anisotropic grains 61 and 62 has an anisotropic crystallization structure, and the TFT property may have the anisotropic property based on the direction of the channel area of the TFT of the active layer which is formed using the silicon thin film 60. That is, the current mobility of the channel area can be changed based on the direction of forming the channel area of the active layer on the silicon thin film 60 having the above crystallization structure.

Figure 3:
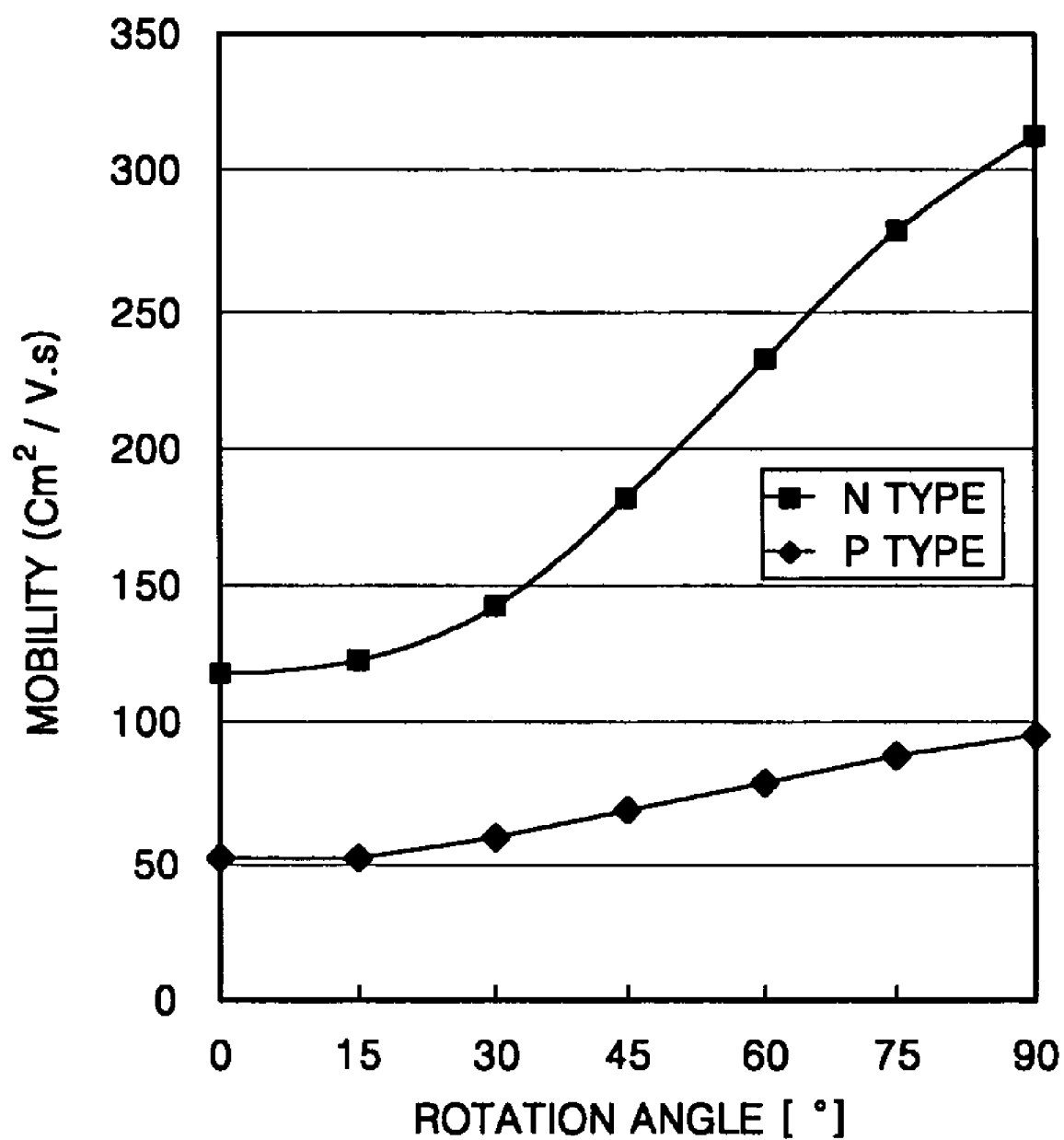
FIG. 3 is a graph of a relation between an angle of primary grain boundaries for current direction on a channel area and a current mobility of the channel area.

FIG. 3 is a graph representing the current mobility in the channel area based on an angle made by the primary grain boundaries 61 and direction of current flow in the channel area.

In FIG. 3, P type represents the current mobility of TFT measured in a device to which P-type impurities are added onto a source area and a drain area, and N type represents the current mobility of TFT measured in a device to which N-type impurities are added onto the source area and the drain area. As shown in FIG. 3, the current mobility in the channel area of a TFT increases as the angle between the direction of current flow in the channel area of the active layer and the primary grain boundaries 61 increases. Thus, the current mobility increases as the angle made by the direction of current flow and the primary grain boundary 61 in the channel area of the active layer increases from 0° to 90°.

The above relation can be described by resistance components for movements of carrier. In a case where the angle between the direction of current flow and the primary grain boundary 61 on the channel area is about 0°, the direction of current flow is substantially perpendicular to the direction of the side grain boundaries of anisotropic grains 62. In addition, when the carrier moves, the moving direction of the carrier is substantially perpendicular the side grain boundaries of anisotropic grains 62. As such, the resistance components for the carrier movement are increased and the current mobility is lowered.

On the contrary, in a case where an angle between the direction of the current flow and the primary grain boundary 61 on the channel area of the active layer is 90°, the flow direction of current flow is substantially parallel to a plurality of side grain boundaries of anisotropic grains 62. Therefore, the side grain boundaries of anisotropic grains 62 is substantially parallel with the moving direction of the carriers when the carrier is moving. As such, the resistance components for the carrier movement are reduced and the current mobility is increased.

More particularly, an amount of the grain boundaries which function as resistances to the moving direction of the carrier causes the difference in current mobility. The difference in the current mobility causes the different on-currents. That is, when the current mobility is small, the on-current is lowered, and when the current mobility is larger, the on-current increases.

The current mobility increases as the angle between the direction of current flow and the direction of the side grain boundaries of anisotropic grains on the channel area reduces, and accordingly, the on-current increases. Similarly, the current mobility reduces as the angle between the direction of current flow and the direction of the side grain boundaries of anisotropic grains on the channel area increases, and accordingly, the on-current reduces. Likewise, the current mobility increases as the angle between the direction of current flow and the direction of the primary grain boundaries on the channel area of the active layer increases, and accordingly, the on-current also increases. In addition, the current mobility reduces as the angle between the direction of current flow and the direction of the primary grain boundaries on the channel area reduces, and accordingly, the on-current also reduces.

Thus, as shown in FIG. 2, generally, the angle made by a length direction of the side grain boundaries of anisotropic grains forming the channel area and the direction of current flow of the driving TFT channel area which requires lower on-current value is larger than the angle made by a length direction of the crystal grain of polycrystalline silicon forming the channel area with the direction of current flow of the switching TFT channel area which requires high on-current value.

As the side grain boundaries of anisotropic grains may be formed in a slightly slanted direction, the angle made by the side grain boundaries of anisotropic grains with the directional current flow in the channel area of the switching TFT may be in a range of about −45°~45°. However, the angle of the primary grain boundaries with the direction of current flow in the channel area of the switching TFT may generally be about 90°.

In addition, in the driving TFT, the angle of the side grain boundaries of anisotropic grains with the direction of current flow in the channel area is in a range of about −45° to about ~45°. However, the angle of the primary grain boundaries with the direction of current flow in the channel area of the driving TFT may generally be about 0°.

On the other hand, the length of a current flowing direction is generally longer than a width of the TFT active layer. In a case where the active layer formed elongated in the direction of currents flow is formed on the silicon thin film shown in FIG. 2, the number of the primary grain boundaries 61 included in the channel area of case A (cases in which the current flowing direction is substantially parallel to the primary grain boundaries 61) may be less than that of case B (cases where the current flowing direction is substantially perpendicular to the primary grain boundaries 61). The number of primary grain boundaries included in the channel area affects the scattering of TFT properties as shown in FIG. 4.

Figure 4:
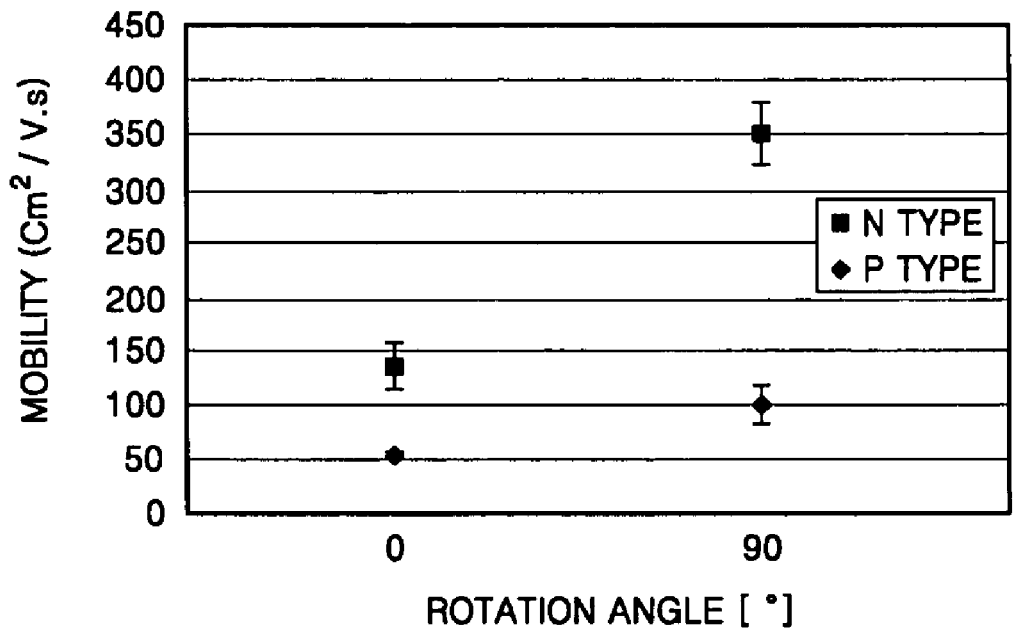
FIG. 4 is a graph of a relation between an angle of primary grain boundaries for the current direction on the channel area and a current mobility scattering on the channel area.

FIG. 4 is a graph of an average value of current mobilities and dispersion on the active layer in which P-type impurities are applied and the active layer in which N-type impurities are applied when the angle of the primary grain boundaries with the direction of current flow is 0° and 90° in the channel area. As shown in FIG. 4, in a case where the angle of the primary grain boundaries with the direction of current flow in the channel area is 90°, the current mobility is high, however, the dispersion of the current mobility is also high because more primary grain boundaries are included in the channel area. On the contrary, in a case where the angle made by the primary grain boundaries with the direction of current flow in the channel area is 0°, the current mobility is low, however, the dispersion of the current mobility is also low because a smaller number of primary grain boundaries are included in the channel area. That is, where the angle of the primary grain boundaries with the direction of current flow in the channel area is 0°. The properties of the device are more uniform than when the angle of the primary grain boundaries with the direction of current flow in the channel area is 90°. Thus, a small amount dispersion is more suitable for driving TFTs, which generally require uniform properties.

Figure 5:
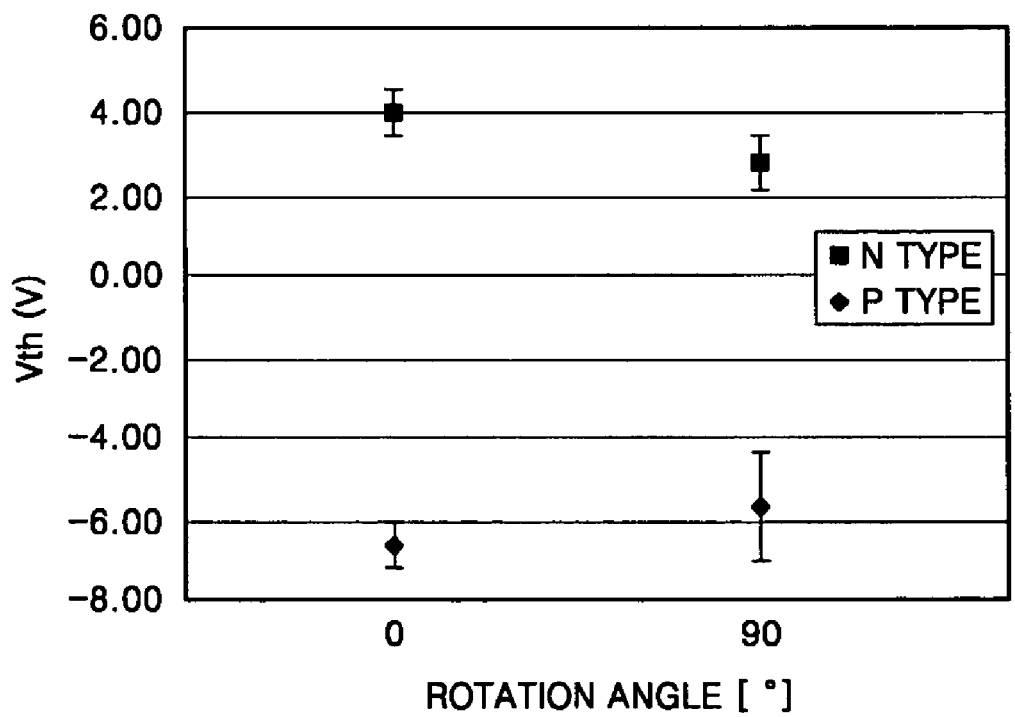
FIG. 5 is a graph of a relation between an angle of primary grain boundaries for current direction on the channel area and Vth dispersion.

FIG. 5 is a graph showing the relation between average values and dispersion of threshold voltage Vth values of the active layer on which P-type impurities are applied and the active layer on which N-type impurities are applied when the angle of primary grain boundaries with the direction of current flow in the channel area is 0° and 90°. As shown in FIG. 5, an average absolute value of the Vth values is smaller when the angle of the primary grain boundaries with the direction of current flow in the channel area is 90° in P-type and N-type. However, the dispersion is smaller for both the P-type and the N-type when the angle is 0°. Therefore, uniform properties of Vth dispersion and the current mobility dispersion which affect the uniformity of an image can be obtained when the angle of the primary grain boundaries with the direction of current flow in the channel area is 0°.

On the other hand, the on-current value when the angle of the primary grain boundaries with the direction of current flow is 0° is much smaller than the on-current value when the angle of the primary grain boundaries with the direction of current flow is 90° due to a turn-on voltage effect which means that the current is in proportion to a value of $(Vg-Vth)^2$.

As described above, when the angle of primary grain boundaries with the direction of current flow in the channel area is 0° the current mobility is smaller, the Vth value is larger, current mobility dispersion is made uniform and Vth value dispersion is more uniform than those when the angle between the direction of current flow in the channel and the direction of the primary grain boundaries is 90°. Thus, when the angle of the primary grain boundaries with the direction of current flow in the channel area is 0° is suitable for the channel area of the driving TFT which requires smaller on-current value and uniform properties. In addition, when the channel area of the switching TFT is designed in a way that the angle of primary grain boundaries with the current flow is not 0°, and is, for example, about 90°, excellent uniform brightness and low on-current properties can be satisfied simultaneously.

Figure 6:
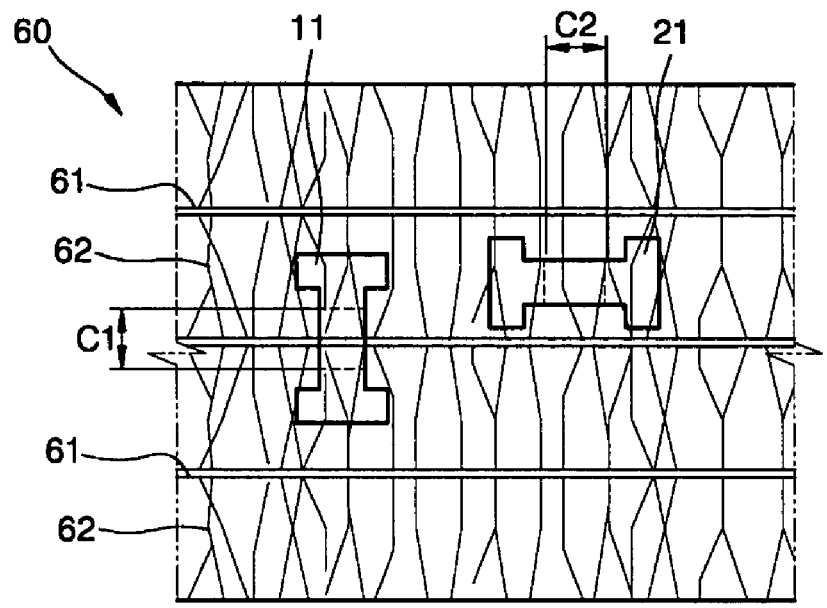
FIG. 6 is a plane view showing that directions of active layers are formed differently from each other according to the anisotropic crystallization structure of the polycrystalline silicon thin film of FIG. 2.

FIG. 6 is a view of the first active layer 11 and the second active layer 21 formed on the silicon thin film shown in FIG. 2 so that the active layers 111 and 21 each have different directions of current flow with the direction of the second grain boundaries 62.

As shown in FIG. 6, the first active layer 11 of the switching TFT is disposed so that the direction of current flow in the channel area (C1) thereof is parallel with the side grain boundaries of anisotropic grains 62, which are substantially perpendicular to the primary grain boundaries 61. In addition, the second active layer 21 of the driving TFT is disposed so that the direction of current flow in the channel area (C2) thereof is substantially perpendicular the side grain boundaries of anisotropic grains 62, that is, parallel with the primary grain boundaries 61. The organic electroluminescence device shown in FIG. 1 is formed in the above way. The side grain boundaries of anisotropic grains 62 in FIG. 6 is formed in a longitudinal direction (up-and-down direction in drawing), and the primary grain boundary 61 is formed on a transverse direction (left-and-right direction in drawing), although these are not directly shown in FIG. 1. Therefore, the first active layers 11 of the switching TFTs 10 of the sub-pixels are arranged to be substantially perpendicular with the primary grain boundaries, and the second active layers 21 of the driving TFTs 20 are arranged to be substantially parallel with the primary grain boundaries, thus lowering the on-current of the driving TFT, realizing the high resolution of the display by lowering the uniformity, and improving the life time property of the light emitting device under the same driving conditions.

The above descriptions are for a single crystallization method, that is, the amorphous silicon thin film is crystallized into the polycrystalline silicon thin film, and the active layers of the switching TFT and the driving TFT are patterned on the crystallized silicon thin film so that the direction of current flow in the channel areas of the switching TFT and the driving TFT are different. However, the invention is not limited to the above method, and can be realized by differentiating the directions of grain boundaries without changing the direction of current flow in the active layers of the switching TFT and the driving TFT.

The respective sub-pixel of the organic electroluminescence device having the switching TFT and the driving TFT has a structure shown in FIGS. 7 through 10.

Figure 7:
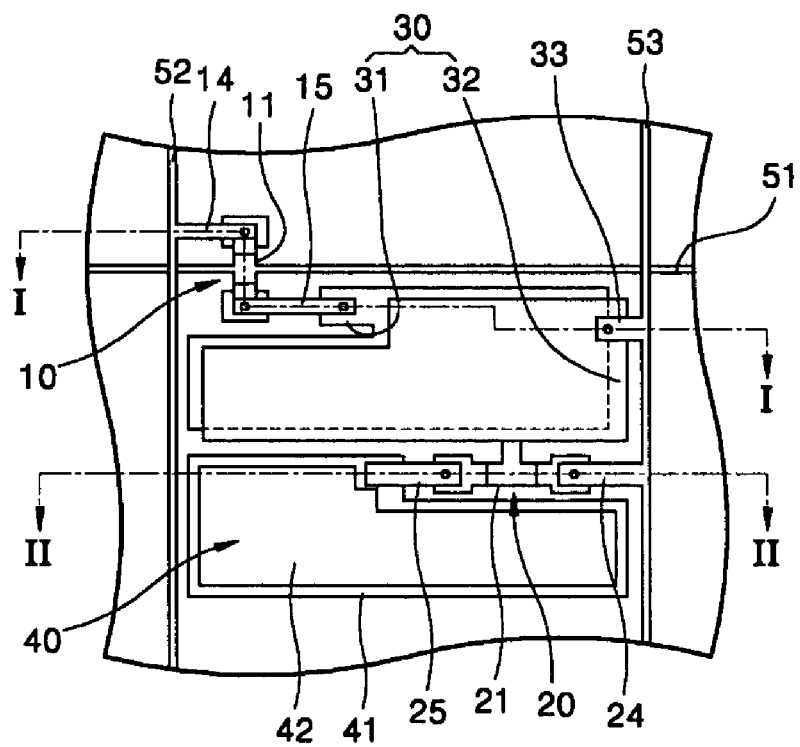
FIG. 7 is a partially enlarged view of one sub-pixel in FIG. 1.
Figure 8:
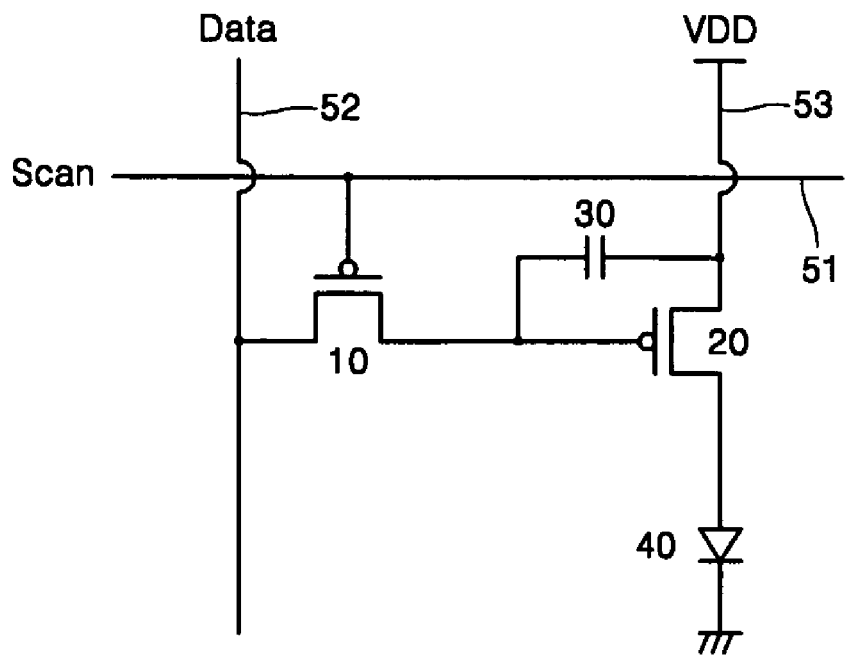
FIG. 8 is an equivalent circuit diagram of a unit pixel in FIG. 7.

FIG. 7 is a partially enlarged plane view of a sub-pixel among the pixels shown in FIG. 1, and FIG. 8 is a view of an equivalent circuit for the sub-pixel shown in FIG. 7. Referring to FIG. 8, the sub-pixel of the active matrix type organic electroluminescence display according to an embodiment of the invention comprises two TFTs such as a switching TFT 10 for switching, a driving TFT for driving, a capacitor 30 and an electroluminescence (EL) device 40. However, the number of TFTs and the number of capacitors are not limited to the number shown, and more or less TFTs and capacitors can be disposed according to a design of a desired device.

The switching TFT 10 is operated by a scan signal which is applied to the gate line 51 to transfer a data signal which is applied to the data line 52. The driving TFT 20 decides current flow to the EL device 40 based on to the data signal transferred through the switching TFT 10, that is, the voltage difference (Vgs) between a gate and a source. The capacitor 30 stores the data signal transferred through the switching TFT 10 for one frame unit.

Figure 9:
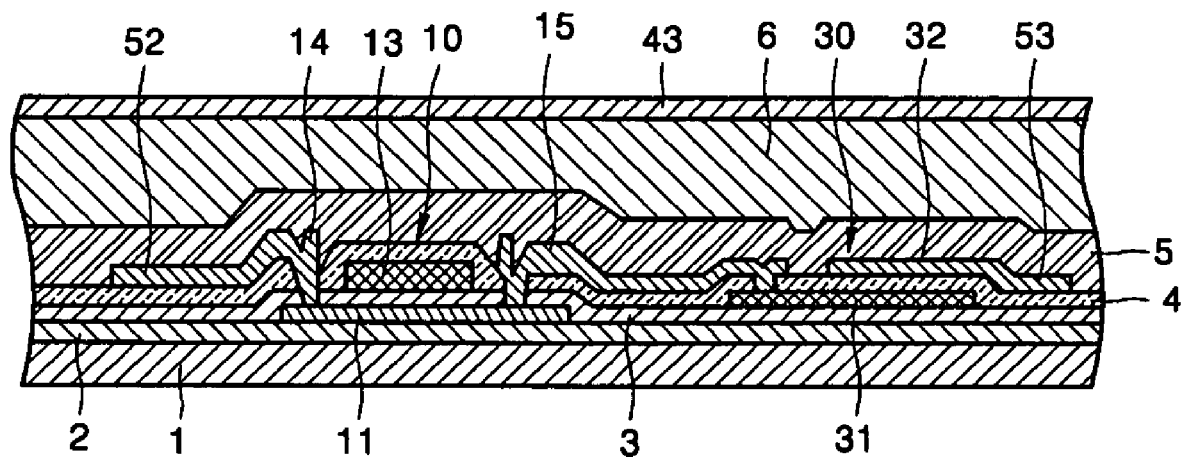
FIG. 9 is a cross-sectional view in line I—I direction in FIG. 7.
Figure 10:
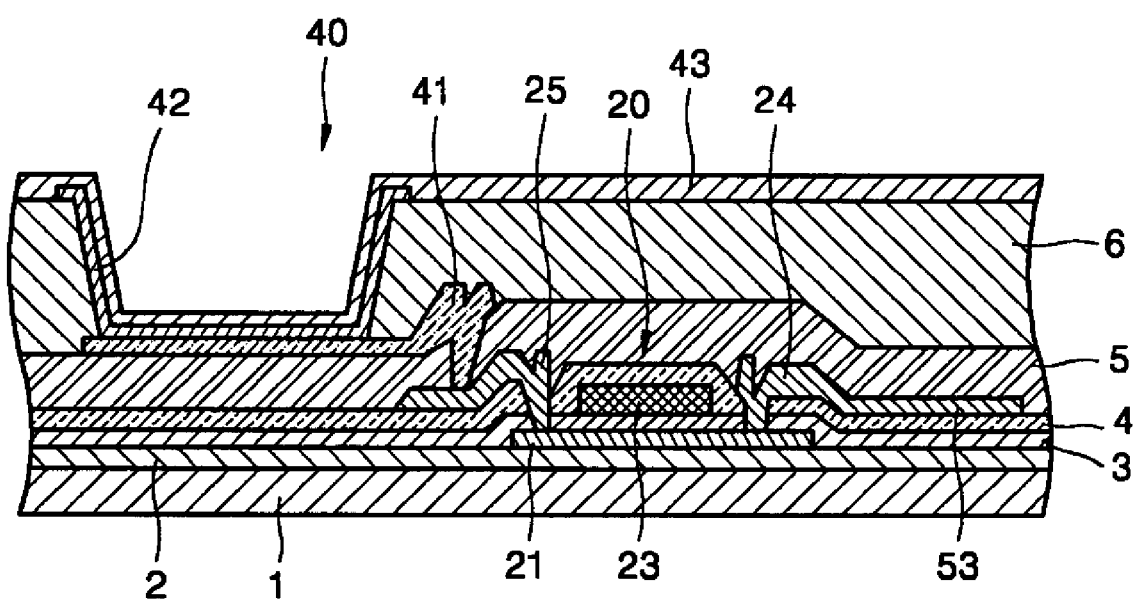
FIG. 10 is a cross-sectional view in line II—II direction in FIG. 7.

The organic electroluminescence display devices having the structure shown in FIGS. 7, 9, and 10 are formed to realize the above circuit. As shown in FIGS. 7, 9, and 10, a buffer layer 2 is formed on an insulating substrate 1 made of glass, and the switching TFT 10, the driving TFT 20, the capacitor 30, and the EL device 40 are disposed on the buffer layer 2.

As shown in FIGS. 7 and 9, the switching TFT 10 includes a gate electrode 13 connected to the gate line 51 for applying TFT on/off signals, a source electrode 14 formed on the gate electrode 13 and connected to the data line 52 for supplying the data signal to the first active layer, and a drain electrode 15 connecting the switching TFT 10 with the capacitor 30 to supply power source to the capacitor 30. A gate insulating layer 3 is disposed between the first active layer 11 and the gate electrode 13.

The capacitor 30 for charging is located between the switching TFT 10 and the driving TFT 20 for storing a driving voltage required to drive the driving TFT 20 for one frame unit, and may include a first electrode 31 connected to the drain electrode 15 of the switching TFT 10, a second electrode 32 formed to overlap the first electrode 31 on an upper part of the first electrode 31 and connected to a driving line 53 through which the power source is applied, and an interlayer dielectric layer 4 formed between the first electrode 31 and the second electrode 32 to be used as a dielectric substance, as shown in FIGS. 7 and 9. The structure of the capacitor 30 is not limited to the above, for example, the silicon thin film of TFT and the conductive layer of the gate electrode may be used as first and second electrodes, and a gate insulating layer may be used as the dielectric layer.

As shown in FIGS. 7 and 10, the driving TFT 20 includes a gate electrode 23 connected to the first electrode 31 of the capacitor 30 for supplying TFT on/off signals, a source electrode 24 formed on an upper part of the gate electrode 23 and connected to the driving line 53 for supplying a reference common voltage to the second active layer 21, and a drain electrode 25 connecting the driving TFT 20 with the EL device 40 for applying a driving voltage to the EL device 40. A gate insulating layer 3 is disposed between the second active layer 21 and the gate electrode 23. Here, the channel area of the second active layer 21 is arranged to be parallel, vertical, or slanted with respect to the grain boundaries according to colors of the sub-pixel.

The EL device 40 displays a predetermined image information by emitting lights of red, green, and blue colors according to flows of the current. As shown in FIGS. 7 and 10, the EL device 40 includes an anode electrode 41 connected to the drain electrode 25 of the driving TFT 20 for receiving positive power from the drain electrode 25, a cathode electrode 43 disposed to cover the substantially all of or the entire pixel for supplying negative power, and an organic emission layer 42 disposed between the anode electrode 41 and the cathode electrode 43 for emitting lights. Reference numeral 5 denotes an insulating passivation layer made of $SiO_2$, and reference numeral 6 denotes an insulating planarized layer made of acryl, or polyimide.

The above layered structure of the organic electroluminescence display according to the exemplary embodiment of the invention is not limited thereto, and the invention can be applied to structures different from the above described structure.

The organic electroluminescence display having the above structure according to the embodiment of the invention can be fabricated as follows.

As shown in FIGS. 9 and 10, a buffer layer 2 is formed on an insulating substrate 1 made, for example, of glass material. The buffer layer 2 can be formed using $SiO_2$ and may be deposited using a plasma enhanced chemical vapor deposition (PECVD) method, an atmospheric pressure chemical vapor deposition (APCVD) method, a low pressure chemical vapor deposition (LPCVD) method, or an electron cyclotron resonance (ECR) method. Also, the buffer layer 2 can be deposited to have a thickness of about 3000 Å.

An amorphous silicon thin film is deposited on an upper part of the buffer layer 2 to have a thickness about 500 Å. The amorphous silicon thin film can be crystallized into the polycrystalline silicon thin film in various ways. Here, it is preferable that the crystallized polycrystalline silicon thin film has an anisotropic crystallization structure which extends in the length direction shown in FIG. 2. In the exemplary embodiment of the invention, SLS method is used to obtain the anisotropic crystallization structure, however, any kind of crystallization method can be used if it can achieve the anisotropic crystallization structure.

After forming the polycrystalline silicon thin film having the anisotropic crystallization structure, the first active layer 111 of the switching TFT 10 and the second active layer 21 of the driving TFT 20 are patterned to each have different directions of current flow as shown in FIG. 1.

After performing the patterning process of the active layers, the gate insulating layer is deposited on the patterned layers using, for example, PECVD, APCVD, LPCVD, or ECR method, and a conductive layer is formed using MoW, or Al/Cu and patterned to form the gate electrode. The active layer, the gate insulating layer, and the gate electrode may be patterned in various orders and methods.

After patterning the active layer, the gate insulating layer, and the gate electrode, N-type or P-type impurities are doped on the source and drain areas.

As shown in FIGS. 9 and 10, after completing the doping process, an interlayer dielectric layer 4 is formed, the source electrodes 14 and 24 and the drain electrodes 15 and 25 are connected to the active layers 11 and 21 through contact holes, and a passivation layer 5 is formed. The layers may adopt various structures according to design of the device.

On the other hand, the EL device 40 connected to the driving TFT 20 can be formed in various ways, for example, an anode electrode 41 connecting to the drain electrode 25 of the driving TFT 20 may be formed and patterned on the passivation layer 5 using an indium tin oxide (ITO), and a planarized layer 6 may be formed on the anode electrode 41.

In addition, after exposing the anode electrode 41 by patterning the planarized layer 6, an organic layer 42 is formed thereon. Here, the organic layer 42 may use a low molecular organic layer or a high molecular organic layer. In a case where the low molecular organic layer is used, a hole injection layer, a hole transfer layer, an organic emission layer, an electron transfer layer, and an electron injection layer may be formed by being stacked in a single or a combination structure. Also, various organic materials such as copper phthalocyanine (CuPc), N,N-Di(naphthalene-1-yl)-N,N'-diphenyl-benzidine (NPB), and tris-8-hydroxyquilnoline aluminum (Alq3) can be used. The low molecular organic layer is formed, for example, in a vacuum evaporation method.

The high molecular organic layer may include the hole transfer layer and an emission layer. Here, the hole transfer layer may be formed using poly(3,4-ethylenedioxythiophene (PEDOT), and the emission layer may be formed using a high molecular organic material such as polyphenylenevinylene (PPV)-based material or polyfluorene-based material in a screen printing method or in an inkjet printing method.

After forming the organic layer, the cathode electrode 43 may be entirely deposited using Al/Ca, or patterned. The cathode electrode 43 may be formed as a transparent electrode in a case where the organic electroluminescence display device is a front emitting type. In addition, the anode electrode 41 and the cathode electrode 43 may be formed on opposite positions. An upper part of the cathode electrode 43 is sealed by the glass or a metal cap.

In the above descriptions, the invention is applied to the organic electroluminescence display device, however, the scope of the invention is not limited thereto. The TFT according to the present invention can be applied to any display devices such as a liquid crystal display (LCD), and inorganic electroluminescence display devices.

According to the invention, current transferred from the driving TFT to the light emitting device can be reduced without changing the size of the active layer in TFT or the driving voltage, and accordingly, a structure suitable for realizing the high resolution can be obtained. A switching TFT having excellent switching properties can be obtained, and at the same time, a driving TFT by which the high resolution can be realized can be obtained using properties of the polycrystalline silicon. In addition, uniform brightness can be obtained and life time degradation can be prevented by arranging TFTs. Also, an aperture area is not reduced since there is no need to increase a length in a current flowing direction of the driving TFT, and a reliability of TFT can be improved since there is no need to reduce a width of the driving TFT.

While the invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display having a plurality of sub-pixels, each sub-pixel comprising:
a light emitting device;
a switching thin film transistor including a semiconductor active layer having at least a channel area for transferring a data signal to the light emitting device; and
only one driving thin film transistor including a semiconductor active layer having at least a channel area for driving the light emitting device so that a predetermined current flows through the light emitting device according to the data signal,
wherein with respect to a direction of any grain boundary, the channel area of the switching transistor is situated along a first direction and the channel area of the driving transistor is situated along a second direction,
wherein a direction of current flow with respect to the grain boundary at the channel area of the switching thin film transistor is different from a direction of current flow with respect to the grain boundary at the channel area of the switching thin film transistor, and
wherein the direction of current flow in the channel area of the switching thin film transistor and the direction of current flow in the channel area of the driving thin film transistor are formed so that a current mobility in the channel area of the switching thin film transistor is larger than a current mobility in the channel area of the driving thin film transistor.

2. The flat panel display of claim 1, wherein the active layer is formed using a polycrystalline silicon.

3. The flat panel display of claim 2, wherein the polycrystalline silicon has anisotropic crystal grains.

4. The flat panel display of claim 3, wherein a crystal grain of the polycrystalline silicon has a first length which is at least 1.5 times longer than a second length in a direction which is substantially perpendicular to a direction of the first length.

5. The flat panel display of claim 2, wherein the channel area of the switching thin film transistor and the channel area of the driving thin film transistor have polycrystalline silicon crystal grains, the silicon grains include longer grain boundaries situated along a direction which makes a first angle with a direction of current flow in the channel area of the switching transistor and a second angle with a direction of current flow in the channel area of the driving transistor.

6. The flat panel display of claim 5, wherein the direction of current flow in the channel area of the switching transistor are formed so that the second angle is larger than the first angle.

7. The flat panel display of claim 2, wherein the polycrystalline silicon includes primary grain boundaries which are arranged substantially parallel to each other, and side grain boundaries of anisotropic grains which extend between the primary grain boundaries in a direction substantially perpendicular to the primary grain boundaries,
wherein adjacent side grain boundaries of anisotropic grains have an average interval therebetween which is shorter than average intervals between adjacent primary grain boundaries.

8. The flat panel display of claim 7, wherein the direction of current flow in the channel area of the switching thin film transistor makes a first angle with a direction along which the primary grain boundaries are situated and the direction of current flow in the channel area of the driving thin film transistor makes a second angle with the direction along which the primary grain boundaries are situated.

9. The flat panel display of claim 8, wherein the first angle is larger than the second angle.

10. The flat panel display of claim 7, wherein an angle of the side grain boundaries of anisotropic grains in the polycrystalline silicon of the channel area of the switching thin film transistor with the direction of current flow in the channel area of the switching thin film transistor is in a range of about −45° to about 45°.

11. The flat panel display of claim 7, wherein an angle of the primary grain boundaries with the direction of current flow in the channel area of the switching thin film transistor is about 90°.

12. The flat panel display of claim 7, wherein an angle of the side grain boundaries of anisotropic grains with the direction of current flow in the channel area of the driving thin film transistor is in a range of about 45° to about 135°.

13. The flat panel display of claim 7, wherein an angle of the primary grain boundaries of the polycrystalline silicon which form the channel area of the driving thin film transistor with the direction of current flow in the channel area is about 0°.

14. A flat panel display having a plurality of sub-pixels, each sub-pixel comprising:
   a light emitting device;
   a switching thin film transistor which is formed using a polycrystalline silicon and includes a semiconductor layer having a channel area for transferring a data signal to the light emitting device; and
   only one driving thin film transistor which is formed using a polycrystalline silicon and includes a semiconductor layer having a channel area for driving the light emitting device so that a predetermined amount of current flows through the light emitting device,
   wherein the channel area of the switching thin film transistor has a first angle between a length direction of polycrystalline silicon grains and a direction of current flow in the channel area and the channel area of the driving thin film transistor has a second angle between a length direction of polycrystalline silicon grains and a direction of current flow in the channel area; and
   wherein the second angle is larger than the first angle.

15. The flat panel display of claim 14, wherein the polycrystalline silicon includes an isotropic crystal grains.

16. The flat panel display of claim 15, wherein the length of the crystal grain of the polycrystalline silicon is at least 1.5 times longer than a width of the crystal grain.

17. The flat panel display of claim 14, wherein the polycrystalline silicon includes substantially parallel primary grain boundaries, and side grain boundaries of anisotropic grains which extend substantially perpendicularly between the primary grain boundaries and have an average interval between the side grain boundaries of anisotropic grains is shorter than an average interval between the primary grain boundaries.

18. The flat panel display of claim 17, further comprising a third angle between the primary grain boundaries of the polycrystalline silicon and the direction of current flow in the channel area of the switching thin film transistor and a fourth angle between the primary grain boundaries of the polycrystalline silicon and the direction of current flow in the channel area of the driving thin film transistor, wherein the third angle is different from the fourth angle.

19. The flat panel display of claim 17, wherein an angle of the side grain boundaries of anisotropic grains of the polycrystalline silicon in the channel area of the switching thin film transistor with the direction of current flow in that channel area is in a range of about 45° to about 45°.

20. The flat panel display of claim 17, wherein an angle of the side grain boundaries of anisotropic grains with the direction of current flow in the channel area of the driving thin film transistor is in a range of about 45° to about 135°.

* * * * *